(12) United States Patent
Zhao et al.

(10) Patent No.: US 10,616,987 B2
(45) Date of Patent: Apr. 7, 2020

(54) SYSTEM AND METHOD FOR IMAGING A SAMPLE WITH AN ILLUMINATION SOURCE MODIFIED BY A SPATIAL SELECTIVE WAVELENGTH FILTER

(71) Applicant: KLA-Tencor Corporation, Milpitas, CA (US)

(72) Inventors: Wei Zhao, Sunnyvale, CA (US); Kenneth P. Gross, San Carlos, CA (US); Ilya Bezel, Sunnyvale, CA (US); Matthew Panzer, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 630 days.

(21) Appl. No.: 14/839,338

(22) Filed: Aug. 28, 2015

(65) Prior Publication Data
US 2017/0059490 A1 Mar. 2, 2017

(51) Int. Cl.
*G01J 1/44* (2006.01)
*H05G 2/00* (2006.01)
(Continued)

(52) U.S. Cl.
CPC .......... *H05G 2/008* (2013.01); *G01J 3/0208* (2013.01); *G01J 3/12* (2013.01); *G01J 3/14* (2013.01);
(Continued)

(58) Field of Classification Search
CPC .......... G01N 21/8806; G01N 21/9501; G01N 21/956; H05G 2/003; H05G 2/008;
(Continued)

(56) References Cited

U.S. PATENT DOCUMENTS 5,142,132 A * 8/1992 MacDonald ........ G03F 7/70233
250/201.9
5,793,049 A 8/1998 Ballard
(Continued)

FOREIGN PATENT DOCUMENTS

CN 103618571 A 3/2014
JP S4833833 A 5/1973
(Continued)

OTHER PUBLICATIONS

PCT International Search Report for PCT/US2016/032743 dated Aug. 26, 2016, 3 pages.
(Continued)

*Primary Examiner* — Georgia Y Epps
*Assistant Examiner* — Kevin Wyatt
(74) *Attorney, Agent, or Firm* — Suiter Swantz pc llo

(57) ABSTRACT

A system for illuminating a sample with a spectrally filtered illumination source includes an illumination source configured to generate a beam of illumination having a first set of wavelengths. In addition, the system includes a wavelength filtering sub-system, a sample stage, an illumination sub-system, a detector, and an objective to focus illumination from the surface of one or more samples and focus the collected illumination to the detector. Further, the wavelength filtering sub-system includes one or more first dispersive elements positioned to introduce spatial dispersion into the beam, a spatial filter element, and one or more dispersive elements positioned to remove spatial dispersion from the beam. The spatial filter element is further positioned to pass at least a portion of the beam including a second set of wavelengths, wherein the second set of wavelengths is a subset of the first set of wavelengths.

37 Claims, 8 Drawing Sheets

(51) Int. Cl.
*G01J 3/18* (2006.01)
*G01N 21/956* (2006.01)
*G01J 3/14* (2006.01)
*G03F 7/20* (2006.01)
*G01J 3/02* (2006.01)
*G01N 21/95* (2006.01)
*G01N 21/88* (2006.01)
*G01J 3/12* (2006.01)
*G02B 26/08* (2006.01)
*G02B 5/20* (2006.01)

(52) U.S. Cl.
CPC ............ *G01J 3/18* (2013.01); *G01N 21/8806* (2013.01); *G01N 21/9501* (2013.01); *G01N 21/956* (2013.01); *G03F 7/7065* (2013.01); *H05G 2/003* (2013.01); *G01J 2003/1213* (2013.01); *G01J 2003/1286* (2013.01); *G02B 5/203* (2013.01); *G02B 26/0833* (2013.01)

(58) Field of Classification Search
CPC ........ G01J 3/12; G01J 3/14; G01J 3/18; G01J 3/0208; G03F 7/7065
USPC ........................................................ 250/206
See application file for complete search history.

(56) References Cited

U.S. PATENT DOCUMENTS

| | | | |
|---|---|---|---|
| 6,141,361 A | 10/2000 | Mears et al. | |
| 6,485,150 B1 * | 11/2002 | Driggers | G01J 3/04 359/361 |
| 6,959,024 B2 | 10/2005 | Paldus et al. | |
| 7,126,682 B2 | 10/2006 | Rowe et al. | |
| 7,492,451 B2 | 2/2009 | Vaez-Iravani et al. | |
| 7,652,430 B1 * | 1/2010 | Delgado | H01J 61/0737 250/504 R |
| 7,786,452 B2 | 8/2010 | Ward et al. | |
| 2004/0263977 A1 * | 12/2004 | Toyoda | G03F 7/701 359/558 |
| 2005/0236585 A1 * | 10/2005 | Miyake | G03F 7/70033 250/492.2 |
| 2006/0001958 A1 * | 1/2006 | Hasegawa | G03F 7/70808 359/443 |
| 2006/0192951 A1 | 8/2006 | Chen et al. | |
| 2008/0165343 A1 | 7/2008 | Lewis et al. | |
| 2013/0016973 A1 | 1/2013 | Zheng et al. | |
| 2013/0106275 A1 * | 5/2013 | Chimmalgi | H01J 61/526 313/39 |
| 2014/0375981 A1 * | 12/2014 | Wang | G01N 21/9501 356/51 |
| 2015/0213461 A1 * | 7/2015 | Marconi | G06Q 30/0185 250/271 |

FOREIGN PATENT DOCUMENTS

| | | |
|---|---|---|
| JP | 2013506162 A | 2/2013 |
| JP | 2013546000 A | 12/2013 |
| JP | 2014521991 A | 8/2014 |
| WO | 2005003746 A1 | 1/2005 |
| WO | 2007064830 A1 | 6/2007 |

OTHER PUBLICATIONS

Gordon Wilson et al. Spectral Passband Filter With Independently Variable Center Wavelength and Bandwidth IEEE Photonics Technology Letters, vol. 18, No. 15, Aug. 1, 2006, pp. 1660-1662 http://psilab.ucsd.edu/publications/(journal_2006)_wilson_(MEMS_spectral_filter).pdf.
Office Action dated Nov. 1, 2019 for Chinese Patent Application No. 201680028562.4.
Office Action dated Feb. 4, 2020 for JP Patent Application No. 2017-560148.

* cited by examiner

SYSTEM AND METHOD FOR IMAGING A SAMPLE WITH AN ILLUMINATION SOURCE MODIFIED BY A SPATIAL SELECTIVE WAVELENGTH FILTER

TECHNICAL FIELD

The present disclosure relates generally to wafer inspection systems, and in particular, to the illumination of a wafer with a spectrally filtered illumination source.

BACKGROUND

The minimum feature size that can be resolved by an optical system designed for inspection or fabrication is inversely proportional to the wavelength of the illumination source. There is therefore a constant need to develop sources with shorter wavelengths and higher intensities at these wavelengths. However, the development of increasingly powerful illumination sources presents new challenges for the development of systems and methods for harnessing this illumination. One significant challenge associated with optical systems designed to work with wavelengths that span into the ultraviolet is that many materials are highly absorbent to short-wavelength illumination. This high absorption not only leads to a reduction of performance, but can also become a factor that limits the allowable intensity of the illumination source. As an example, many coatings designed to filter the spectrum of ultraviolet illumination sources are driven to high temperatures due to high absorption of illuminated light, a process called thermal loading. This thermal loading can ultimately lead to component damage or photo-contamination in the system. Therefore, it is desirable to cure the defects identified above in the prior art.

SUMMARY

An ultraviolet illumination source with wavelength selection control is disclosed, in accordance with an illustrative embodiment of the present disclosure. In one illustrative embodiment, the ultraviolet illumination source includes an illumination source configured to generate a beam of illumination that includes a first set of wavelengths. In another illustrative embodiment the ultraviolet illumination source includes a first set of one or more optical elements, wherein the first set of one or more optical elements includes one or more first dispersive elements positioned to introduce spatial dispersion into the beam. In another illustrative embodiment, the ultraviolet illumination source includes a spatial filter element, wherein the spatial filter element is positioned in a plane conjugate to the illumination source, wherein the spatial filter element is configured to pass at least a portion of the beam, wherein the beam directed from the spatial filter element includes a second set of wavelengths, wherein the second set of wavelengths is a subset of the first set of wavelengths. In another illustrative embodiment, the ultraviolet illumination source includes a second set of one or more optical elements, wherein the second set of one or more optical elements is positioned to collect at least a portion of the beam, wherein the second set of one or more optical elements includes one or more second dispersive elements positioned to remove spatial dispersion from the beam.

A system for illuminating a sample with a spectrally filtered illumination source is disclosed, in accordance with an illustrative embodiment of the present disclosure. In one illustrative embodiment, the system includes an illumination source configured to generate a beam of illumination that includes a first set of wavelengths. In another illustrative embodiment, the system includes a wavelength filtering sub-system. In another illustrative embodiment the wavelength filtering sub-system includes a first set of one or more optical elements, wherein the first set of one or more optical elements includes one or more first dispersive elements positioned to introduce spatial dispersion into the beam. In another illustrative embodiment, the wavelength filtering sub-system includes a spatial filter element, wherein the spatial filter element is positioned in a plane conjugate to the illumination source, wherein the spatial filter element is configured to pass at least a portion of the beam, wherein the beam directed from the spatial filter element includes a second set of wavelengths, wherein the second set of wavelengths is a subset of the first set of wavelengths. In another illustrative embodiment, the wavelength filtering sub-system includes a second set of one or more optical elements, wherein the second set of one or more optical elements is positioned to collect at least a portion of the beam, wherein the second set of one or more optical elements includes one or more second dispersive elements positioned to remove spatial dispersion from the beam. In another illustrative embodiment, the system includes a sample stage for securing one or more samples. In another illustrative embodiment, the system includes an illumination sub-system configured to illuminate at least a portion of the one or more samples with at least a portion of the second set of wavelengths via an illumination pathway. In another illustrative embodiment, the system includes a detector. In another illustrative embodiment, the system includes an objective configured to focus illumination from a surface of the one or more samples and focus the collected illumination via a collection pathway to the detector to form an image of at least a portion of the surface of the one or more samples on the detector.

A system for illuminating a sample with a spectrally filtered illumination source is disclosed, in accordance with another illustrative embodiment of the present disclosure. In one illustrative embodiment, the system includes an illumination source configured to generate a beam of illumination that includes a first set of wavelengths. In another illustrative embodiment, the system includes a wavelength filtering sub-system. In another illustrative embodiment, the wavelength filtering sub-system includes a first set of one or more optical elements, wherein the first set of one or more optical elements includes one or more first dispersive elements positioned to introduce spatial dispersion into the beam. In another illustrative embodiment, the wavelength filtering sub-system includes a spatial filter element, wherein the spatial filter element is positioned in a plane conjugate to the illumination source, wherein the spatial filter element is positioned to reflectively pass at least a portion of the beam, wherein the beam directed from the spatial filter element includes a second set of wavelengths, wherein the second set of wavelengths is a subset of the first set of wavelengths, wherein the beam directed from the spatial filter element propagates back through the one or more optical elements in a mirrored path such that spatial dispersion is removed from the beam. In another illustrative embodiment, the system includes a sample stage for securing one or more samples. In another illustrative embodiment, the system includes an illumination sub-system configured to illuminate at least a portion of the one or more samples with at least a portion of the second set of wavelengths via an illumination pathway. In another illustrative embodiment, the system includes a detector. In another illustrative embodiment, the system includes an objective configured to focus illumination from the surface of the one or more samples and focus the collected illumination via a collection pathway to the detector to form an image of at least a portion of the surface of the one or more samples on the detector. In another illustrative embodiment, the system includes an objective configured to focus illumination from a surface of the one or more samples and focus the collected illumination via a collection pathway to the detector to form an image of at least a portion of the surface of the one or more samples on the detector.

A method for filtering ultraviolet illumination for sample imaging is disclosed, in accordance with an illustrative embodiment of the present disclosure. In one illustrative embodiment, the method includes generating a beam of illumination including a first set of wavelengths. In another illustrative embodiment, the method includes introducing spatial dispersion into the beam. In another illustrative embodiment, the method includes directing the beam onto a spatial filter element, such that the beam directed from the spatial filter element includes a second set of wavelengths, wherein the second set of wavelengths is a subset of the first set of wavelengths. In another illustrative embodiment, the method includes collecting at least a portion of the beam directed from the spatial filter element. In another illustrative embodiment, the method includes removing spatial dispersion from the beam.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

Referring generally to FIGS. 1A through 4, a system and method for filtering the spectral radiation of an illumination source are described in accordance with the present disclosure. Embodiments of the present disclosure are directed to the selection of a desired set of wavelengths from the spectrum of an illumination source. Additional embodiments are directed to the coupling of the spectrally filtered wavelengths with illumination optics of a corresponding imaging system (e.g. a wafer inspection sub-system, a metrology sub-system, and the like). Some embodiments of the present disclosure are directed to wavelength selection in high power and extremely short wavelength systems.

Figure 1A:
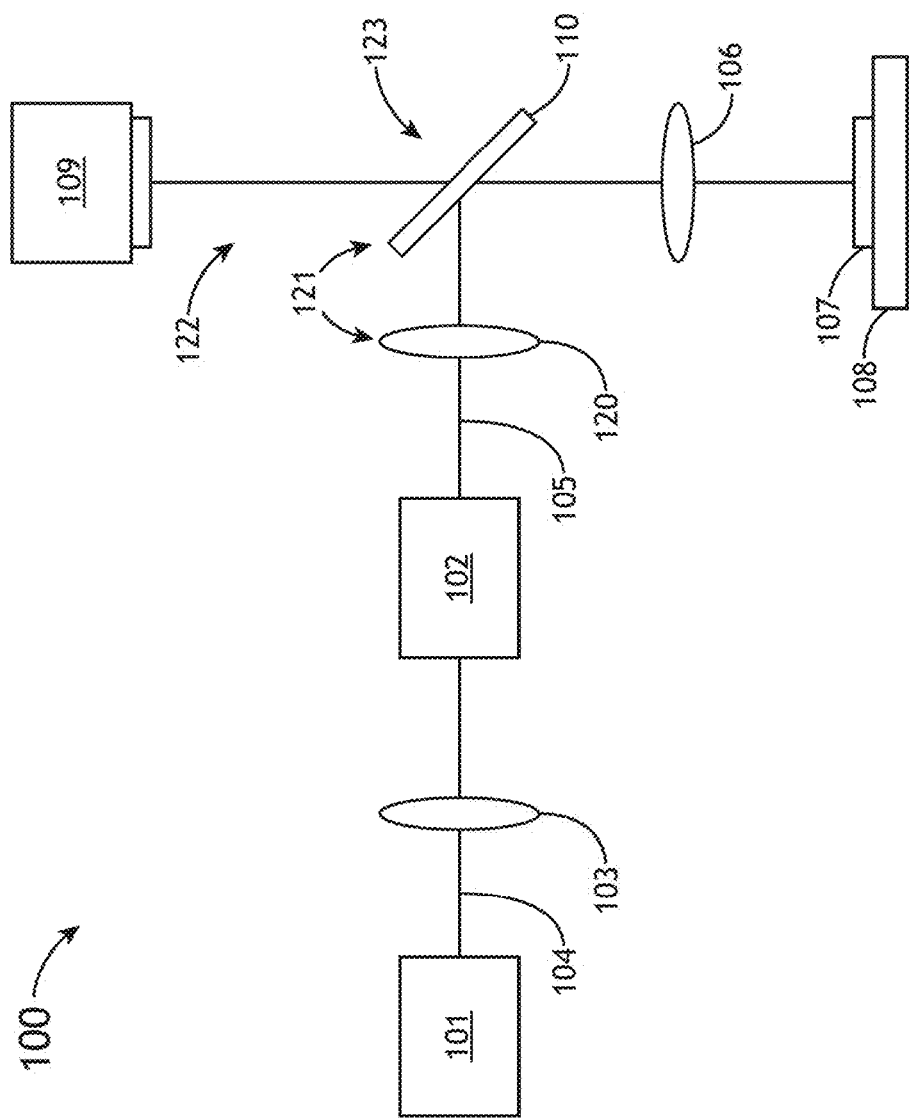
FIG. 1A is a conceptual view of a system for imaging a sample with a spectrally filtered illumination source in accordance with one embodiment of the present disclosure.

FIG. 1A illustrates a system 100 for imaging a sample with a spectrally filtered portion of an illumination source 101, in accordance with an embodiment of the present disclosure. The illumination source 101 generates an illumination output defining a beam 104 having a spectrum comprised of a first set of wavelengths. By way of non-limiting example, the first set of wavelengths may include, but is not limited to, wavelengths in the infrared, visible, ultraviolet (UV), deep ultraviolet (DUV), extreme ultraviolet (EUV), and/or vacuum ultraviolet (VUV) regions of the electromagnetic spectrum. In some embodiments, at least a portion of the beam 104 may be collected and directed by one or more optical elements 103. It is noted that the one or more optical elements 103 may include, but are not limited to, one or more lenses, prisms, gratings, polarizing elements, waveplates, or apertures. It is further noted that the one or more optical elements may be configured to modify the temporal or spatial profile of the beam 104 as well as to control the divergence of the beam 104 (e.g. to produce a beam 104 that is collimated, diverging, or converging).

Figure 1B:
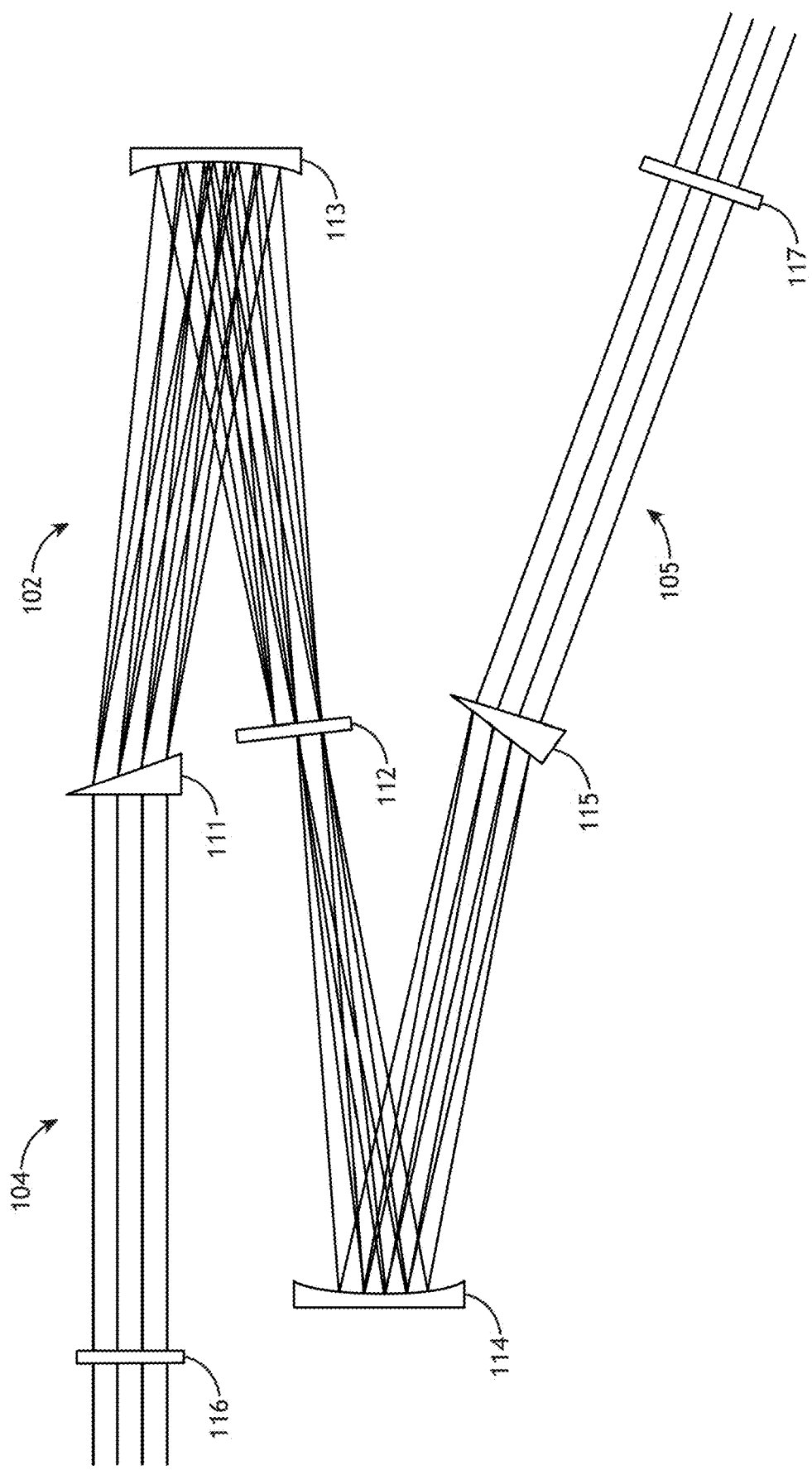
FIG. 1B is a schematic view of a wavelength filtering sub-system in accordance with one embodiment of the present disclosure.

Referring generally to FIG. 1B, in one embodiment, the beam 104 is directed to a wavelength filtering sub-system 102 within the system 100. In one embodiment, the beam 104 passes through the entrance pupil 116 of the wavelength filtering sub-system 102 and is incident on a dispersion element 111 (e.g. a prism) positioned to introduce spatial dispersion into the beam 104. In this regard, each wavelength within the first set of wavelengths is directed from the dispersion element 111 at a different angle. A focusing element 113 is positioned to collect and focus the beam 104 onto a spatial filter element 112 configured to pass only a portion of the beam having a second set of wavelengths. It is noted herein that the second set of wavelengths is a subset of the first set of wavelengths. Due to the spatial dispersion induced by the dispersion element 111, the focusing element 113 focuses each wavelength to a different location on the spatial filter element 112. In one embodiment, the spatial filter element 112 is an aperture with one or more openings positioned such that only the second set of wavelengths pass through the one or more openings. In some embodiments, a second focusing element 114 is positioned to collect and collimate the selected wavelengths of light passed by the spatial filter element 112. In some embodiments, a second dispersion element (e.g. a prism) 115 is positioned to remove the spatial dispersion and produce a beam 105. The beam 105 that passes through the exit pupil 117 of the wavelength filtering sub-system 102 is thus a spectrally filtered version of the beam passing through the entrance pupil 116.

It is noted herein that the any of the dispersive elements 111 and/or 115 may include any number of dispersive components known in the art and may include, but are not limited to, refractive elements (e.g. prisms) and diffractive elements (e.g. diffraction gratings that operate in either reflection or transmission modes). In one embodiment, as shown in FIGS. 1E and 1F, dispersive element 111 includes a prism array 111b, or equivalently a Fresnel prism 111b. It is noted herein that a prism array 111b with an apex angle 136 and a width 134 may introduce the same dispersion to a beam 104 as a traditional prism 111a with the same apex angle 136 and a width 132. In this way, a reduction from the thickness 132 to thickness 134 may reduce the absorption of light (e.g. UV light) in the dispersive element 111. It is further noted that any of the dispersive elements 111 and/or 115 may include any combination of refractive and diffractive elements. By way of non-limiting example, the dispersive elements 111 and/or 115 may include, but are not limited to, one or more prisms of any one of traditional or Fresnel types. As another non-limiting example, the dispersive element 111 may include, but is not limited to, one diffraction gratings and the dispersive element 115 may include, but is not limited to, one or more prisms. It is further noted herein that any lens element in the system 100 (e.g., elements 103 and 106) may include one or more Fresnel lenses.

It is further noted that any of the dispersion elements 111 and/or 115 may be fabricated out of any material known in the art suitable for the purpose of introducing dispersion. For example, a transmissive dispersive element 111 and/or 115 such as a prism or a transmission diffraction grating may be formed from a material such as, but not limited to, MgF2, LiF, CaF2, sapphire, crystalline quartz, fused silica, SUPRASIL 1, SUPRASIL 2, SUPRASIL 300, SUPRASIL 310, HERALUX PLUS, HERALUX-VUV, and the like. It is again noted herein that materials such as, but not limited to, $CaF_2$, $MgF_2$, crystalline quartz and sapphire provide transparency to short-wavelength radiation (e.g., $\lambda$<190 nm). The degree of spatial dispersion introduced by a refraction-based dispersive optical element 111 and/or 115 (e.g. a prism) into the beam 104 is dependent on the material choice as well as physical design considerations such as the incident angles of the beam 104 on any surfaces. It is further noted that a diffraction-based dispersive element 111 and/or 115 such as a diffraction grating may be fabricated using any manufacturing process known in the art. Diffraction-based dispersive elements 111 and/or 115 may include, but are not limited to, holographic gratings, ruled gratings, blazed gratings, Volume Bragg Gratings (VBGs), or gratings fabricated using a direct-write process such as femtosecond laser direct writing either on the surface of or within the bulk of a material.

It is noted that the present disclosure is not limited to the focusing elements 113 and 114 described previously herein, which are provided merely for illustrative purposes. In some embodiments, the focusing elements 113 and/or 114 may not be included. The focusing elements 113 and/or 114 may be formed from any type of lens known in the art. For example, the focusing elements 113 and/or 114 may include, but are not limited to, one or more spherical lenses or one or more cylindrical lenses. It is noted herein that the shape of the one or more passband regions of the spatial filter element 112 may be defined by the shape of the image of the illumination source 101 on the spatial filter element 112, which is affected by any elements positioned on the optical path of the beam 104 between the illumination source 101 and the spatial filter element 112. By way of non-limiting example, the dispersive element 111 is a linear prism positioned such that the beam exhibits linear spatial dispersion in one dimension and a focusing element 113 is a cylindrical lens positioned such that each wavelength from the illumination source 101 is focused to a line on the spatial filter element 112. Furthermore, in this configuration, each wavelength is focused onto a different spatial location on the spatial filter.

Figure 2:
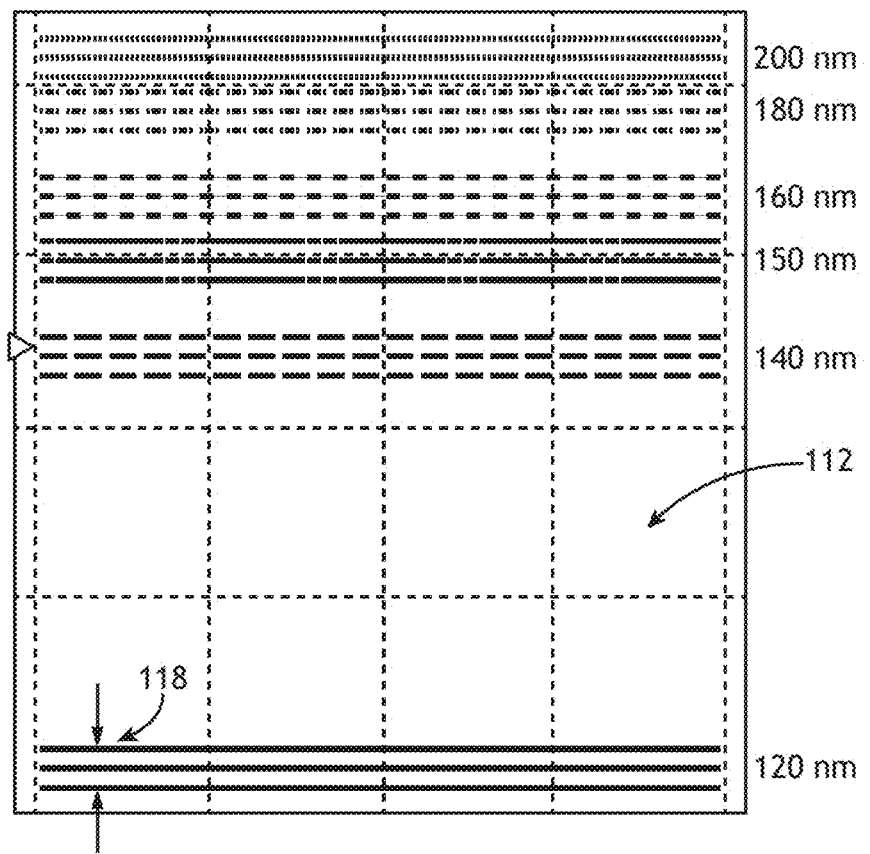
FIG. 2 is a conceptual view of a spatially dispersed image of an extended illumination source configured such that each wavelength is imaged to a line, wherein the width of the line is related to the size of the illumination source, in accordance with one embodiment of the present disclosure.

FIG. 2 illustrates a conceptual view of the image of the illumination source 101 on the spatial filter element 112 in accordance with one embodiment of the present disclosure. In this embodiment, each wavelength of the illumination source 101 is imaged to a line on the spatial filter element 112. The width of the line 118 is related to the spatial extent of the imaged portion of the illumination source 101. It is further noted that the contrast with which the spatial filter element 112 will be able to selectively pass a desired wavelength and block a second wavelength is dependent on the width of the line 118 corresponding to each wavelength on the spatial filter element 112; the smaller this linewidth, the smaller the spatial overlap of wavelengths on the spatial filter element 112 and the higher the contrast of the spatial filter. Referring to the conceptual view in FIG. 2, the illumination source 101 may have a spectrum including wavelengths in the wavelength range of 120 nm to 200 nm. Each wavelength is imaged to a line on the spatial filter element 112 and the width of each line 118 represents the imaged size of the illumination source 101. In some embodiments, the system 100 may include elements 103 such as optics or filters (e.g. a spectrally selective coating or a spatial filter) configured to limit the spectral content and/or the effective size of the illumination source 101 as seen by the remainder of the system 100. It is further noted herein that the shape and size of the image of the illumination source 101 on the spatial filter element 112 may be designed in order to minimize fabrication constraints on the spatial filter element 112. For example, imaging the illumination source such that each wavelength is in the shape of a line (e.g. in accordance with FIG. 2) may make the spatial filter element 112 easier and/or cheaper to fabricate relative to imaging the illumination source 101 such that each wavelength is in the shape of a circle.

In one embodiment, the illumination 104 is collimated by any combination of optics including illumination source 101 and optical elements 103. Then, the collimated illumination 104 may be directed to a dispersion element 111, and focused onto the spatial filter element 112 by a focusing element 113. The illumination source 101 and the spatial filter element 112 are positioned in an infinite conjugate configuration with respect to the focusing element 113, which is to say that the image of the illumination source as well as the spatial filter element 112 are located at the focal length of the focusing element 113. It is noted herein that the present disclosure is not limited to this particular configuration, which is provided merely for illustrative purposes. It is noted that the present disclosure may be extended to any arrangement where the illumination source 101 and the spatial filter element 112 are positioned in any number of finite conjugate positions such that the spatial filter element 112 is at an image plane of the illumination source 101.

In another embodiment, the function of the dispersion element 111 and the focusing element 113 may be accomplished using a single physical component such as a curved diffraction grating that introduces spatial dispersion into the beam 104 and simultaneously focuses the beam 104 onto the spatial filter element 112. Similarly, the functions of the dispersive element 115 and focusing element 114 may be accomplished using a single physical component.

It is noted that the spatial filter element 112 may include any type of spatial filter known in the art. In some embodiments, the spatial filter is formed by an aperture that includes one or more openings. In this regard, the second set of wavelengths (i.e. those that are passed by the spatial filter element 112) may propagate through the one or more openings of the aperture. In one embodiment, the wavelengths that are rejected by the spatial filter element are absorbed by the spatial filter element 112. In another embodiment, the spatial filter element 112 has a highly reflective surface that reflects the rejected wavelengths. In another embodiment, the spatial filter may be formed by a spatial light modulator having a control unit, wherein the spatial light modulator contains individually addressable regions, or pixels, that can be configured using the control unit to pass or reject wavelengths incident on each pixel. Such a spatial light modulator may operate in either transmission mode in which selected passed wavelengths are directed through the spatial light modulator or reflection mode in which selected passed wavelengths are reflected. In other embodiments, the spatial filter includes a microelectromechanical system (MEMS) device or a nanoelectromechanical system (NEMS) device that can be configured to pass select wavelengths according to their location on the device. In one embodiment, a MEMS-based spatial filter element 112 may be configured as a deformable mirror such that selected wavelengths to be passed are directed to subsequent elements in the system such as a focusing optic 114, while the remaining wavelengths are reflected away from the spatial filter element 112 (e.g., reflected to as a beam block or baffle). In this regard, the MEMS-based spatial filter element 112 serves to reject the wavelengths not selected for being passed through the spatial filter element 112.

Figure 1C:
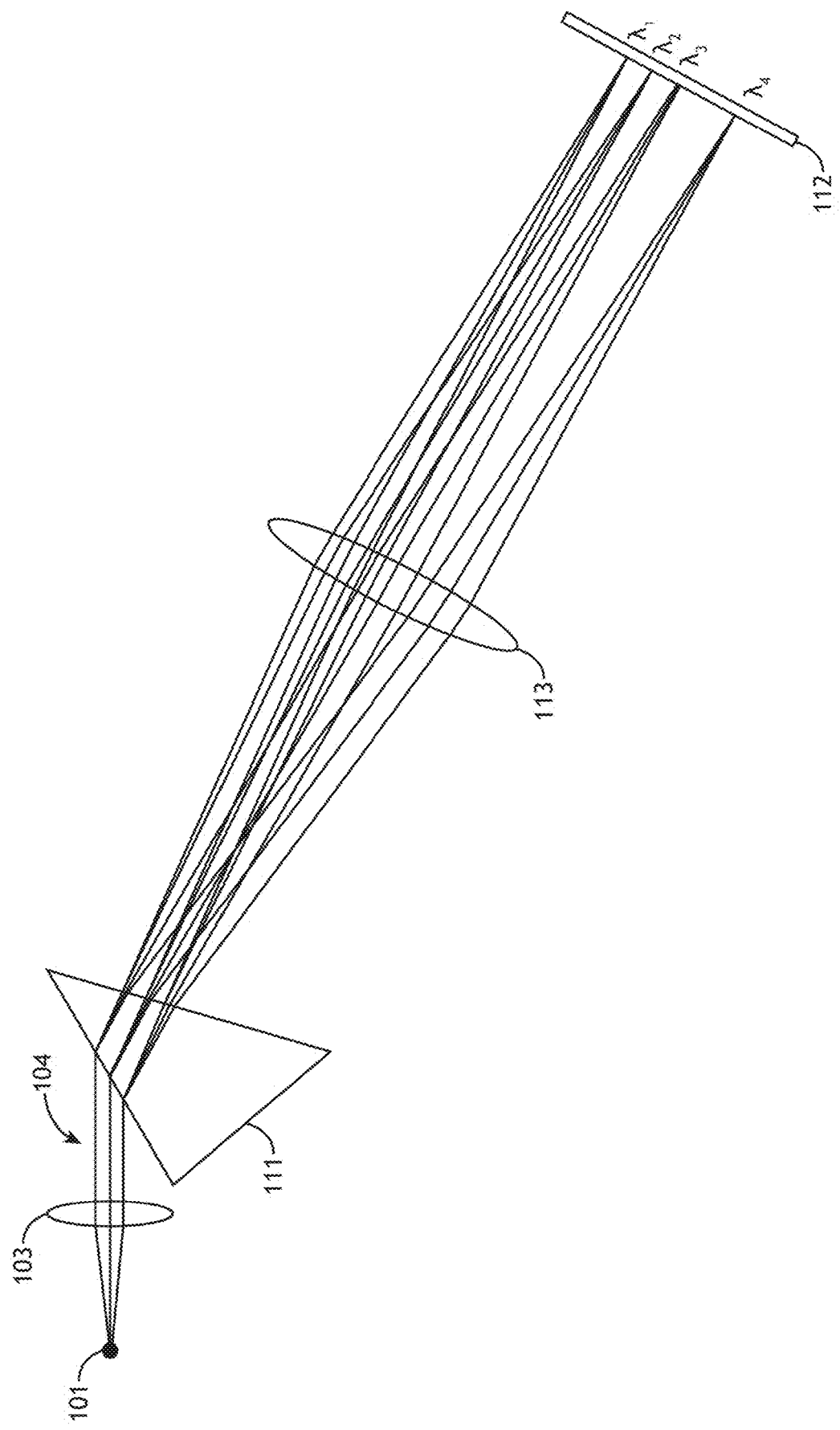
FIG. 1C is a schematic view of a wavelength filtering sub-system configured with optically mirrored illumination pathways in accordance with one embodiment of the present disclosure.
Figure 1D:
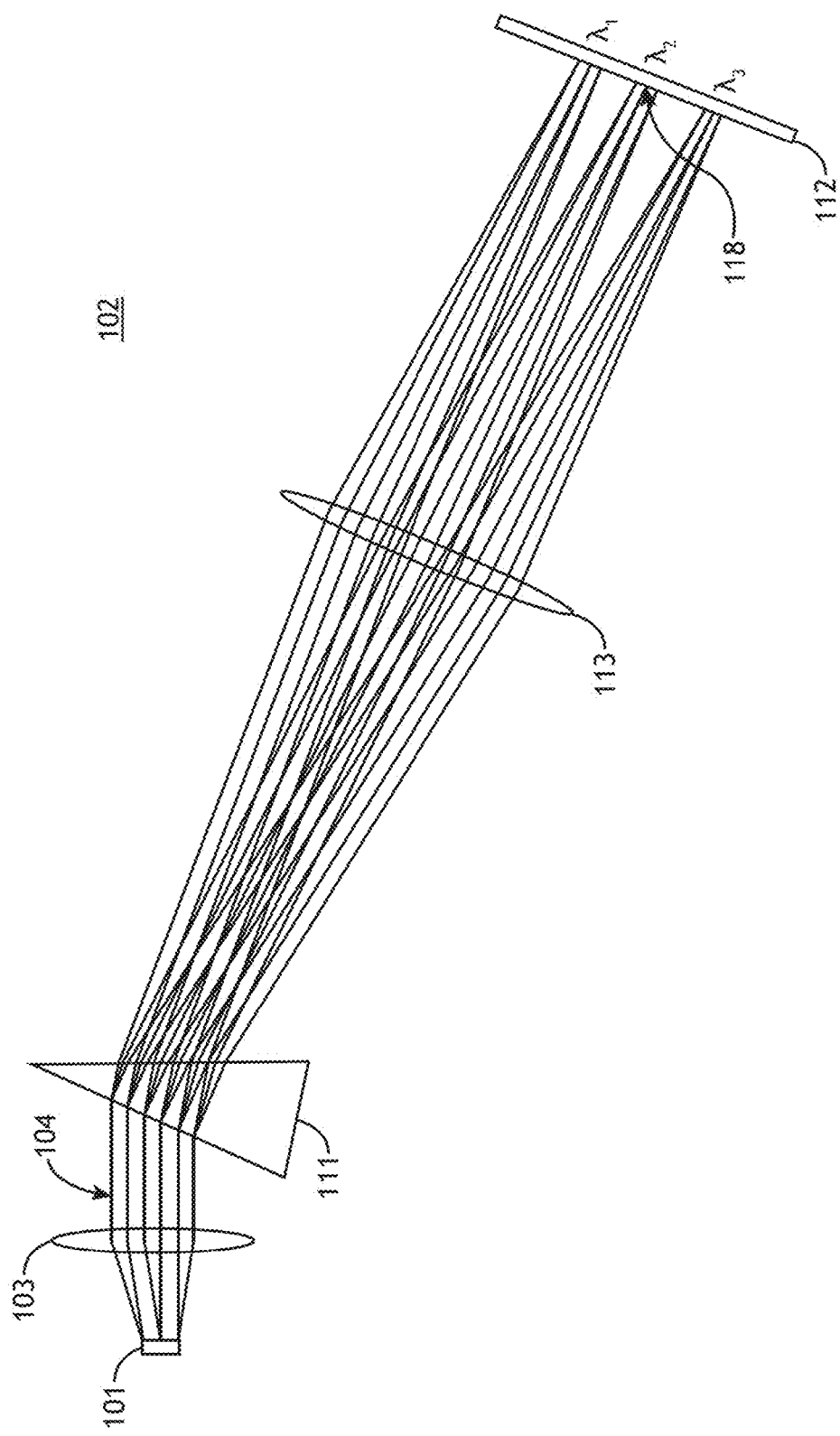
FIG. 1D is a schematic view of a wavelength filtering sub-system configured with optically mirrored illumination pathways and an extended illumination source in accordance with one embodiment of the present disclosure.
Figure 1F:
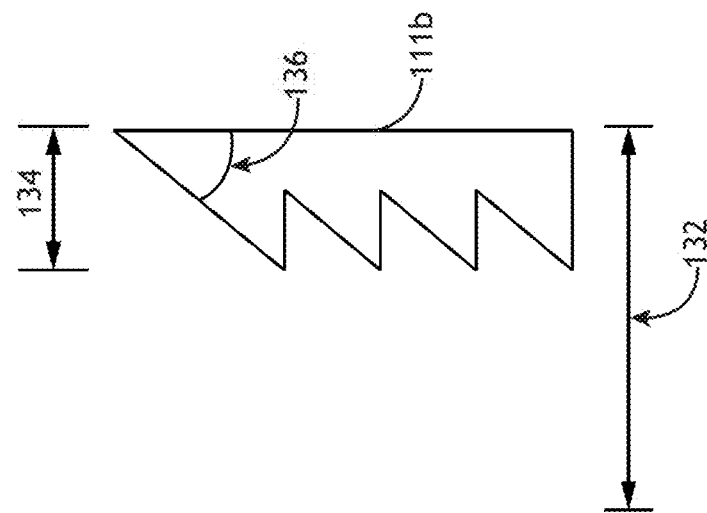
FIG. 1F is a conceptual view of a prism array used as a dispersive element in accordance with one embodiment of the present disclosure.
Figure 1E:
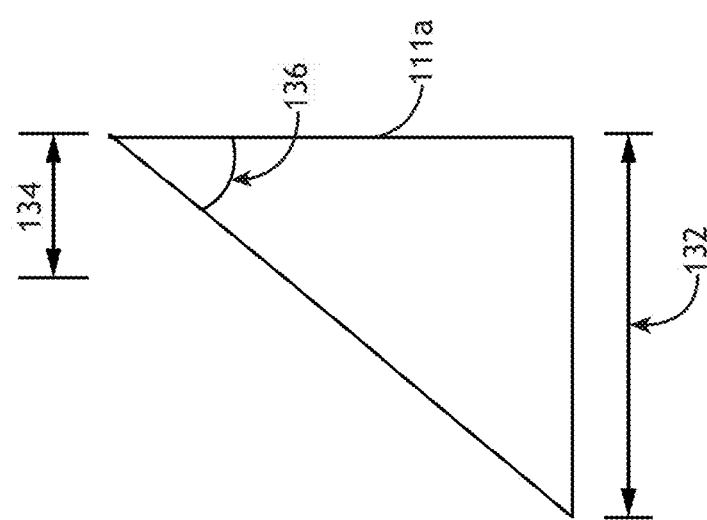
FIG. 1E is a conceptual view of a traditional triangular prism used as a dispersive element in accordance with one embodiment of the present disclosure.

Referring generally to the simplified schematic views in FIGS. 1C and 1D, in some embodiments, the number of physical elements in the system 100 can be reduced by utilizing a configuration that is optically symmetric around a spatial filter element 112. In this regard, the spatial filter element 112 is configured to operate in a reflective mode: the selected second set of wavelengths are reflected from the spatial filter element 112, and propagate through the dispersive element 111 along a mirrored optical path such that the spatial dispersion in the beam 104 is removed. Simplified schematic views illustrating this embodiment are shown in FIG. 1C and FIG. 1D, showing an illumination source 101 configured to be a point source and an extended source, respectively. In one embodiment, a beam 104 is incident on a dispersive element 111 (e.g. a prism) positioned to introduce spatial dispersion into the beam 104. A focusing element 113 is positioned to collect and focus the beam 104 onto a spatial filter element 112 configured to operate in reflective mode. A selected second set of wavelengths are reflected from the spatial filter element 112 and pass through elements 111 and 113 a second time through a mirrored optical path. An output beam 105 may be selected and differentiated from the input beam 104 through any method known in the art. For example, in a non-limiting embodiment, optical elements 103 may be configured to include a polarizing beam splitter and a quarter-wave plate for selected wavelengths such that the second set of wavelengths passed by the spatial filter element 112 are deflected along a different optical path than the input beam 104 upon interaction with the polarizing beam splitter on the second pass. The resulting beam 105 would then be directed to the illumination pathway 122 and ultimately to the sample 107.

It is noted herein that one of the advantages of the wavelength filtering subsystem 102 is improved performance for short-wavelength illumination 104 (e.g. UV, EUV, DUV, and/or VUV illumination). The thermal properties of the material out of which the spatial filter element 112 is fabricated will, in part, control the maximum power limit of the wavelength filtering subsystem 102 inasmuch as at least a portion of the energy associated with wavelengths rejected by the spatial filter element 112 may be absorbed. In one non-limiting example, the spatial filter element 112 is made of a metal capable of absorbing and dissipating (e.g. via an attached heat sink) the thermal load induced by the absorption of the wavelengths rejected by the spatial filter element 112. In another non-limiting embodiment, the spatial filter element 112 is configured to have a highly reflective surface such that a minimal fraction of the energy of the wavelengths rejected by the spatial filter element 112 are absorbed by the spatial filter element 112; rather, this energy is reflected away from the spatial filter element 112 to additional elements within the system 100 such as beam blocks or baffles designed to absorb and dissipate the energy. It is further noted that while short-wavelength illumination sources offer advantages in terms of optical performance, they pose unique challenges to the design of the system 100 including limited availability of materials capable of adequately transmitting or reflecting the illumination 104 with acceptable absorption loss. Furthermore, excessive absorption by components within the system 100 may lead to damage and photo-contamination risks that ultimately reduce the performance or lifetime of the system 100.

In one embodiment, the illumination source 101 comprises a laser-sustained plasma (LSP) source configured to generate illumination 104 of a set of wavelengths or a wavelength range, such as, but not limited to infrared radiation, visible radiation, UV radiation, DUV radiation, and/or VUV radiation. In one embodiment, the illumination source 101 is a laser-sustained plasma source, which generates broadband light via a plasma maintained within a plasma lamp. For example, the plasma lamp of a LSP-based illumination source may include, but is not limited to, a plasma cell or plasma bulb. In another embodiment, the illumination source 101 includes a discharge source such as, but not limited to, a plasma discharge lamp. By way of non-limiting example, the illumination source 101 may include, but is not limited to, a deuterium lamp. In another embodiment, the illumination source 101 may include two or more light sources in order to produce an illumination source 101 having a larger number of wavelengths than possible with a single source.

In additional embodiments, the illumination source is comprised of one or more narrowband illumination sources such as one or more laser sources. In a general sense, the illumination source 101 may include any laser system known in the art. By way of non-limiting example, the illumination source 101 may include any laser system known in the art configured to generate a set of wavelengths or a wavelength range, such as, but not limited to infrared radiation, visible radiation, UV radiation, DUV radiation, and/or VUV radiation. In one embodiment, the illumination source 101 may include a laser system configured to emit continuous wave (CW) laser radiation. For example, the illumination source 101 may include one or more CW ultraviolet laser sources configured for use in wafer inspection tool where it is desirable to have a short-wavelength source such as UV, DUV, EUV, or VUV illumination in order to achieve a desired resolution. It is noted herein that an illumination source 101 configured to produce CW illumination is not limiting and any illumination source 101 known in the art may be implemented in the context of the present invention. In another embodiment, the illumination source may be a pulsed laser source with pulse lengths of timescales including, but not limited to milliseconds, microseconds, nanoseconds, picoseconds, or femtoseconds. In another embodiment, the illumination source 101 may be configured to produce a modulated output. For example, the illumination source 101 may be modulated with an acousto-optic or an electro-optic modulator to produce temporally shaped illumination.

In another embodiment, the illumination source 101 may include one or more excimer laser systems. By way of non-limiting example, the illumination source may include an excimer laser configured to use molecular fluorine as an active gas to emit 157 nm laser light. In another embodiment, the illumination source 101 may include one or more diode laser systems. In another embodiment, the illumination source may include a diode laser configured to emit at 445 nm.

In another embodiment, the illumination source 101 may include one or more frequency converted laser systems. By way of non-limiting example, the illumination source 101 may include a gas ion laser with a nominal central illumination wavelength of 458 nm coupled with a Beta Barium Borate (BBO) crystal to produce illumination with a 229 nm central wavelength.

In another embodiment, the system 100 includes a stage assembly 108 suitable for securing a sample 107. The stage assembly 108 may include any sample stage architecture known in the art. For example, the stage assembly 108 may include, but is not limited to, any combination of linear stages, rotational stages or multi-axis stages. Further, the sample 107 may include a wafer, such as, but not limited to, a semiconductor wafer.

In another embodiment, the system 100 includes an imaging sub-system 121. The imaging sub-system 121 may include, but is not limited to, lenses 120, and beam splitters 110. Additionally, the imaging sub-system 121 may include, but is not limited to, apertures, filters, homogenizers, polarizers, beam splitters, and/or beam-shaping elements suitable for delivering illumination from the wavelength-filtering sub-system 102 to the one or more samples 107. It is noted herein that the imaging sub-system 121 may be coupled to the illumination output of the wavelength-filtering sub-system 102 and that it works in tandem with the objective 106. In this regard, the imaging sub-system 121 may inspect, or otherwise analyze, one or more samples 107 utilizing the illumination output (e.g., UV, DUV, EUV, or VUV light with selected wavelengths) from the wavelength-filtering sub-system 102.

In another embodiment, the imaging sub-system 121 includes an objective 106 and a detector 109. In one embodiment, the objective 106 may collect illumination after it is scattered or reflected from one or more portions of the one or more samples 107 (or particles disposed on the sample 107). The objective may additionally focus the collected illumination via a collection pathway 123 to a detector 109 to form an image of one or more portions of the surface of the one or more samples 107. It is noted herein that the objective 106 may include any objective known in the art suitable for performing inspection (e.g., darkfield inspection or brightfield inspection) or optical metrology. Further, it is noted herein that the detector 109 may include any optical detector known in the art suitable for measuring illumination received from the one or more samples 107. For example, the detector 109 may include, but is not limited to, a CCD detector, a TDI detector, or the like.

Figure 3:
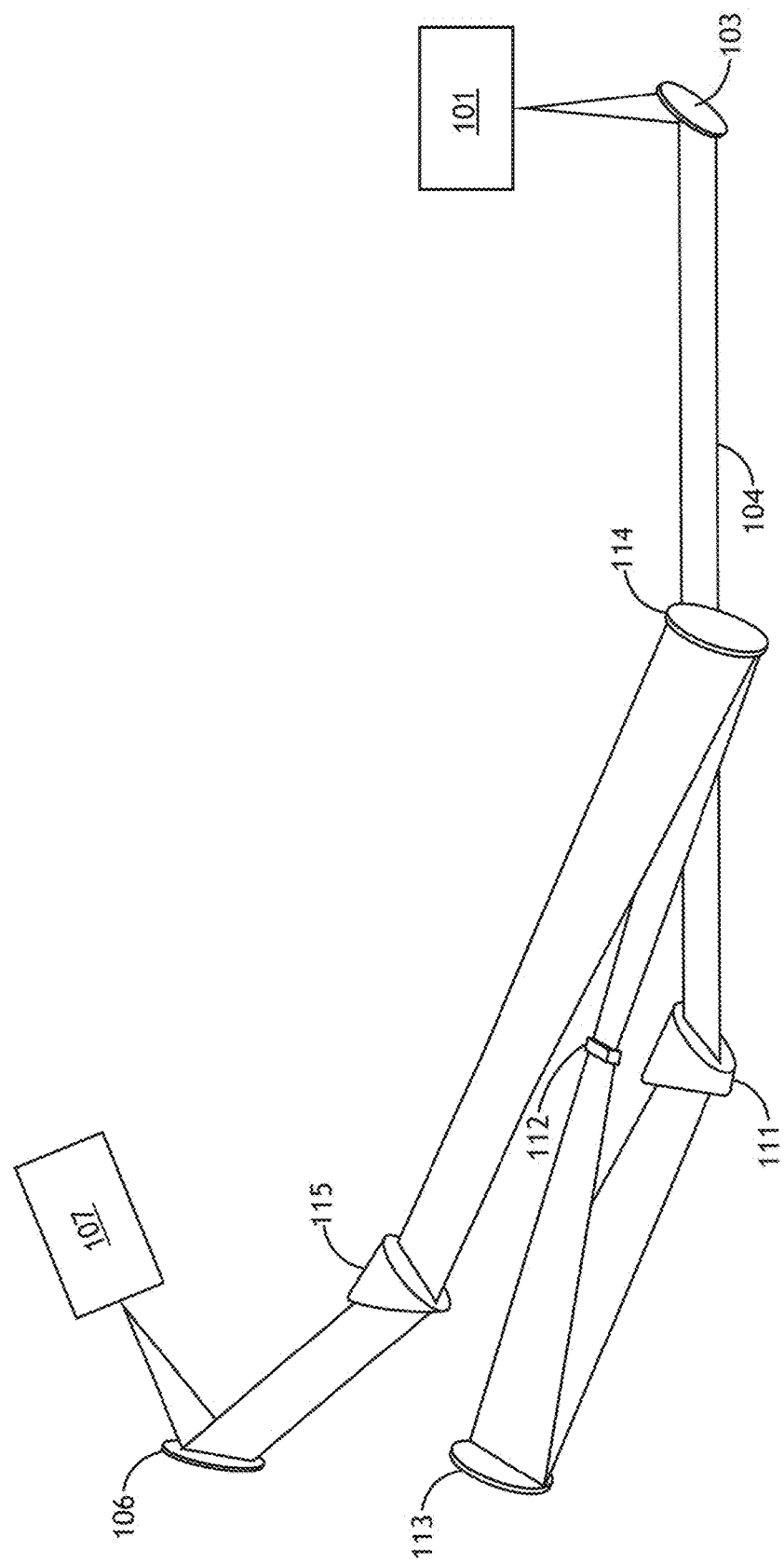
FIG. 3 is a schematic view of a system for illuminating a sample with a spectrally filtered illumination source in accordance with one embodiment of the present disclosure.

Referring generally to FIG. 3, in one embodiment, the system 100 is configured to direct short-wavelength illumination onto a sample 107. The illumination source 101 includes a laser-sustained plasma source generating illumination with a first set of wavelengths in the range of 190 nm-450 nm. The beam of illumination 104 is collected and collimated by an off-axis parabolic mirror 103. The beam 104 is then further directed to a dispersive element 111 (e.g. a prism), which introduces spatial dispersion into the beam 104. The beam is then incident on a focusing element 113 (e.g. a cylindrical mirror) and focused onto a spatial filter element 112 configured to include an aperture with one or more openings, wherein the spatial filter element 112 is positioned to pass a second set of wavelengths. The beam 104 directed from the spatial filter element 112 is collected and collimated by a focusing element 114 (e.g. a cylindrical mirror) and further directed to a dispersive element 115 (e.g. a prism), which removes the spatial dispersion from the beam 104. The beam 104 is then collected by a second off-axis parabolic mirror and directed to a sample 107.

It is noted herein that any of the elements in the system 100 may be configured to include one or more coatings, including, but not limited to, anti-reflective coatings or spectrally selective coatings. By way of non-limiting example, a spectrally selective coating may be placed on the faces of the dispersing element 111 and/or 115, focusing elements 113 and/or 114, and/or the spatial filter element 112 in order to further limit the spectral content of the beam 104 and/or 105. In another embodiment, anti-reflective coatings may be placed on non-optical elements of the system 100 including an enclosing chamber for the purposes of reducing stray light throughout the system 100.

It is noted herein that the set of optics of system 100 as described above and illustrated in FIGS. 1A through 1D are provided merely for illustration and should not be interpreted as limiting. It is anticipated that a number of equivalent or additional optical configurations may be utilized within the scope of the present invention. By way of non-limiting example, one or more optical filters may be positioned along either the illumination pathway or the collection pathway in order to filter illumination prior to light entering the wavelength filtering sub-system 102 or to filter illumination following the wavelength-filtering sub-system 102. One or more optical filters may further be positioned in the illumination sub-system 122 or a collection pathway 123.

Figure 4:
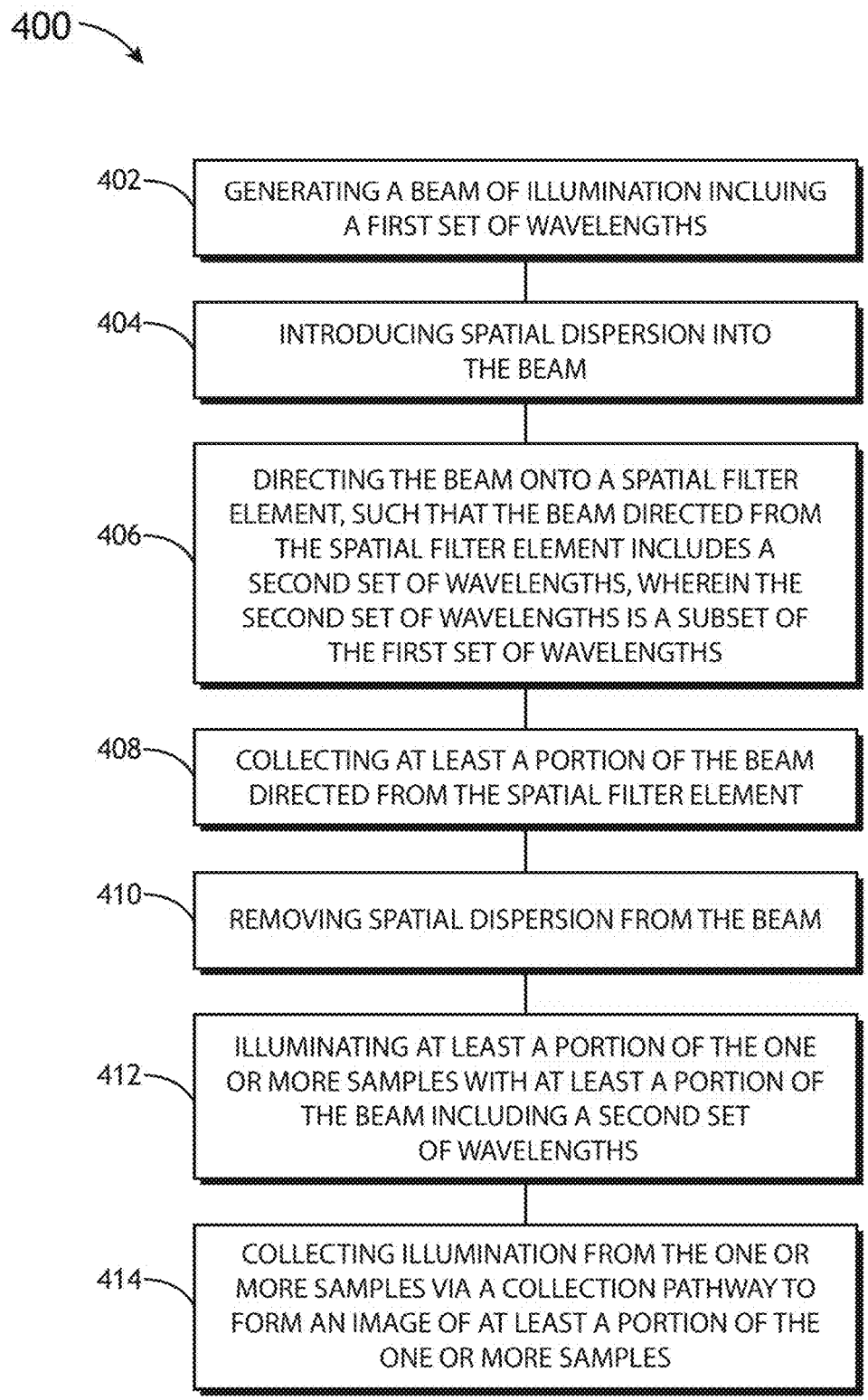
FIG. 4 is a flow diagram depicting a method for imaging a sample with a spectrally filtered illumination source in accordance with one embodiment of the present disclosure.

FIG. 4 illustrates a flow diagram depicting a method 400 for imaging a sample with an illumination source having a filtered spectral content, in accordance with one embodiment of the present disclosure. In step 402, a beam of illumination 104 including a first set of wavelengths (e.g. illumination with a set of wavelengths or a wavelength range in the infrared, visible, UV, DUV, EUV, and/or VUV portions of the electromagnetic spectrum) is generated. In step 404, spatial dispersion is introduced into the beam 104 using a dispersion element 111. In step 406, the beam 104 having spatial dispersion is directed to a spatial filter element 112 such that the beam directed from the spatial filter element 112 includes a second set of wavelengths, wherein the second set of wavelengths is a subset of the first set of wavelengths. In step 408, at least a portion of the beam 104 directed from the spatial filter element 112 is collected. In step 410, spatial dispersion is removed from the beam 104.

In one embodiment, the spatial dispersion may be removed by a second dispersive element 115. In another embodiment, the spatial filter element 112 is configured to reflect the selected wavelengths in a mirror configuration such that the spatial dispersion may be removed by the same dispersion element 111 that initially produced the dispersion. In step 412, one or more samples are illuminated with at least a portion of the selected second set of wavelengths via an illumination pathway 122 coupled with an objective 106. In step 414, illumination from the one or more samples 107 is collected. For example, light scattered or reflected from the one or more samples 107 may be imaged via a combination of the objective 106 and a collection pathway 123 onto a detector 109.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An ultraviolet illumination source with wavelength selection control, comprising:
   an illumination source configured to generate a beam of illumination that includes a first set of wavelengths;
   a first set of one or more optical elements, wherein the first set of one or more optical elements includes one or more first dispersive elements positioned to introduce spatial dispersion into the beam to form a set of sub-beams associated with each of the first set of wavelengths;
   one or more focusing elements;
   a spatial filter element, wherein the spatial filter element is positioned in a plane conjugate to the illumination source, wherein the one or more focusing elements are configured to focus each of the set of sub-beams of the beam onto the spatial filter element, wherein the spatial filter element is configured to pass at least a subset of the sub-beams, wherein the subset of the sub-beams directed from the spatial filter element are associated with a second set of wavelengths, wherein the second set of wavelengths is a subset of the first set of wavelengths, wherein the second set of wavelengths comprises wavelengths in at least one of the extreme ultraviolet spectrum, the deep ultraviolet spectrum, or the vacuum ultraviolet spectrum; and
   a second set of one or more optical elements, wherein the second set of one or more optical elements is positioned to collect at least a portion of the beam, wherein the second set of one or more optical elements includes one or more second dispersive elements positioned to remove spatial dispersion from the beam containing the subset of the sub-beams.

2. The ultraviolet illumination source of claim 1, wherein the spatial filter element comprises an aperture having one or more openings and is positioned such that the sub-beams associated with the second set of wavelengths passes through the one or more openings.

3. The ultraviolet illumination source of claim 1, wherein the spatial filter element comprises a spatial light modulator.

4. The ultraviolet illumination source of claim 3, wherein the spatial light modulator includes a deformable mirror.

5. The ultraviolet illumination source of claim 1, wherein the illumination source comprises a laser-sustained plasma light source.

6. The ultraviolet illumination source of claim 1, wherein the illumination source comprises a discharge source.

7. The ultraviolet illumination source of claim 1, wherein at least one of the first set of optical elements or the second set of optical elements includes a cylindrical mirror.

8. The ultraviolet illumination source of claim 1, wherein at least one of the one or more first dispersive elements or the one or more second dispersive elements includes one or more prisms.

9. The ultraviolet illumination source of claim 8, wherein the one or more prisms includes one or more prism arrays.

10. The ultraviolet illumination source of claim 1, wherein at least one of the one or more first dispersive elements or the one or more second dispersive elements includes one or more diffraction gratings.

11. The ultraviolet illumination source of claim 10, wherein the one or more diffraction gratings includes at least one of a planar diffraction grating or a curved diffraction grating.

12. A system for illuminating a sample with a spectrally filtered illumination source, comprising:
    an illumination source configured to generate a beam of illumination that includes a first set of wavelengths;
    a wavelength filtering sub-system, comprising:
       a first set of one or more optical elements, wherein the first set of one or more optical elements includes one or more first dispersive elements positioned to introduce spatial dispersion into the beam to form a set of sub-beams associated with each of the first set of wavelengths;
       one or more focusing elements;
       a spatial filter element, wherein the spatial filter element is positioned in a plane conjugate to the illumination source, wherein the one or more focusing elements are configured to focus each of the set of sub-beams of the beam onto the spatial filter element, wherein the spatial filter element is configured to pass at least a subset of the sub-beams, wherein the subset of the sub-beams directed from the spatial filter element are associated with a second set of wavelengths, wherein the second set of wavelengths is a subset of the first set of wavelengths, wherein the second set of wavelengths comprises wavelengths in at least one of the extreme ultraviolet spectrum, the deep ultraviolet spectrum, or the vacuum ultraviolet spectrum; and a second set of one or more optical elements, wherein the second set of one or more optical elements is positioned to collect at least a portion of the beam, wherein the second set of one or more optical elements includes one or more second dispersive elements positioned to remove spatial dispersion from the beam containing the subset of the sub-beams;

a sample stage for securing one or more samples;

an illumination sub-system configured to illuminate at least a portion of the one or more samples with at least a portion of the second set of wavelengths via an illumination pathway;

a detector; and an objective configured to focus illumination from a surface of the one or more samples and focus the collected illumination via a collection pathway to the detector to form an image of at least a portion of the surface of the one or more samples on the detector.

13. The system of claim 12, wherein the spatial filter element comprises an aperture having one or more openings, wherein the spatial filter element is positioned such that the second set of wavelengths pass through the one or more openings.

14. The system of claim 12, wherein the spatial filter element comprises a spatial light modulator.

15. The system of claim 14, wherein the spatial light modulator includes a deformable mirror.

16. The system of claim 12, wherein the illumination source comprises a laser-sustained plasma.

17. The system of claim 12, wherein the illumination source comprises a discharge source.

18. The system of claim 12, wherein at least one of the first set of optical elements or the second set of optical elements includes a cylindrical mirror.

19. The system of claim 12, wherein at least one of the one or more first dispersive elements or the one or more second dispersive elements includes one or more prisms.

20. The system of claim 19, wherein the one or more prisms includes one or more prism arrays.

21. The system of claim 12, wherein at least one of the one or more first dispersive elements or the one or more second dispersive elements includes one or more diffraction gratings.

22. The system of claim 21, wherein the one or more diffraction gratings includes at least one of a planar diffraction grating or a curved diffraction grating.

23. The system of claim 12, wherein the detector comprises at least one of a CCD detector or a TDI detector.

24. A system for illuminating a sample with an illumination source, comprising:

an illumination source configured to generate a beam of illumination that includes a first set of wavelengths;

a wavelength filtering sub-system, comprising:

one or more optical elements, wherein the one or more optical elements includes one or more dispersive elements positioned to introduce spatial dispersion into the beam, wherein the one or more optical elements include one or more focusing elements; and a spatial filter element, wherein the spatial filter element is positioned in a plane conjugate to the illumination source, wherein the one or more focusing elements are configured to focus each of a set of sub-beams of the beam onto the spatial filter element, wherein the spatial filter element is positioned to reflectively pass at least a subset of the sub-beams, wherein the subset of the sub-beams directed from the spatial filter element are associated with a second set of wavelengths, wherein the second set of wavelengths is a subset of the first set of wavelengths, wherein the second set of wavelengths comprises wavelengths in at least one of the extreme ultraviolet spectrum, the deep ultraviolet spectrum, or the vacuum ultraviolet spectrum, wherein the beam directed from the spatial filter element propagates back through the one or more optical elements in a mirrored path such that spatial dispersion is removed from the beam containing the subset of the sub-beams;

a sample stage for securing one or more samples;

an illumination sub-system configured to illuminate at least a portion of the one or more samples with at least a portion of the second of wavelengths via an illumination pathway;

a detector; and an objective configured to focus illumination from a surface of the one or more samples and focus the collected illumination via a collection pathway to the detector to form an image of at least a portion of the surface of the one or more samples on the detector.

25. The system of claim 24, wherein the spatial filter element comprises an aperture having one or more openings, wherein the spatial filter element is positioned such that the sub-beams associated with the second set of wavelengths pass through the one or more openings.

26. The system of claim 24, wherein the spatial filter element comprises a spatial light modulator.

27. The system of claim 26, wherein the spatial light modulator includes a deformable mirror.

28. The system of claim 24, wherein the illumination source comprises a laser-sustained plasma.

29. The system of claim 24, wherein the illumination source comprises a discharge source.

30. The system of claim 24, wherein at least one of the first set of optical elements or the second set of optical elements includes a cylindrical mirror.

31. The system of claim 24, wherein at least one of the one or more first dispersive elements or the one or more second dispersive elements includes one or more prisms.

32. The system of claim 31, wherein the one or more prisms includes one or more prism arrays.

33. The system of claim 24, wherein at least one of the one or more first dispersive elements or the one or more second dispersive elements includes one or more diffraction gratings.

34. The system of claim 33, wherein the one or more diffraction gratings includes at least one of a planar diffraction grating or a curved diffraction grating.

35. The system of claim 24, wherein the detector comprises at least one of a CCD detector and a TDI detector.

36. A method for preparing ultraviolet illumination for sample imaging, comprising:

generating a beam of illumination including a first set of wavelengths; introducing spatial dispersion into the beam to form a set of sub-beams associated with each of the first set of wavelengths;

focusing the sub-beams onto a spatial filter element such that a subset of the sub-beams directed from the spatial filter element includes a second set of wavelengths, wherein the second set of wavelengths is a subset of the first set of wavelengths, wherein the second set of wavelengths comprises wavelengths in at least one of the extreme ultraviolet spectrum, the deep ultraviolet spectrum, or the vacuum ultraviolet spectrum;

collecting at least a portion of the beam containing the subset of the sub-beams directed from the spatial filter element; and removing spatial dispersion from the beam containing the subset of the sub-beams.

37. The method of claim 36, further comprising:

illuminating at least a portion of one or more samples with at least a portion of the beam containing the subset of the sub-beams; and collecting illumination from the one or more samples via a collection pathway to form an image of at least a portion of the one or more samples.

\* \* \* \* \*